United States Patent
Avraham et al.

(10) Patent No.: US 11,258,465 B2
(45) Date of Patent: Feb. 22, 2022

(54) CONTENT AWARE DECODING METHOD AND SYSTEM

(71) Applicant: Western Digital Technologies, Inc., San Jose, CA (US)

(72) Inventors: Dudy David Avraham, Even Yehuda (IL); Eran Sharon, Rishon Lezion (IL); Omer Fainzilber, Herzeliya (IL); Alexander Bazarsky, Holon (IL); Stella Achtenberg, Netanya (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 24 days.

(21) Appl. No.: 16/931,305

(22) Filed: Jul. 16, 2020

(65) Prior Publication Data
US 2020/0350930 A1    Nov. 5, 2020

Related U.S. Application Data

(62) Division of application No. 16/137,256, filed on Sep. 20, 2018, now Pat. No. 10,735,031.

(51) Int. Cl.
*H03M 13/39* (2006.01)
*G06F 17/18* (2006.01)
*H03M 7/30* (2006.01)

(52) U.S. Cl.
CPC ........ *H03M 13/3927* (2013.01); *G06F 17/18* (2013.01); *H03M 7/6005* (2013.01); *H03M 13/3972* (2013.01)

(58) Field of Classification Search
CPC .. H03M 13/3927; H03M 7/6005; G06F 17/18
See application file for complete search history.

(56) References Cited

U.S. PATENT DOCUMENTS

| | | | |
|---|---|---|---|
| 6,377,607 B1 * | 4/2002 | Ling | H03M 13/6337 375/130 |
| 6,928,590 B2 | 8/2005 | Ilkbahar et al. | |
| 8,055,979 B2 | 11/2011 | Wu et al. | |
| 8,286,048 B1 | 10/2012 | Chen et al. | |
| 8,374,026 B2 | 2/2013 | Sharon et al. | |
| 8,401,402 B2 | 3/2013 | Cai et al. | |
| 8,560,919 B2 | 10/2013 | D'Abreu et al. | |

(Continued)

FOREIGN PATENT DOCUMENTS

WO    2007082626 A2    7/2007

OTHER PUBLICATIONS

Choe et al. "Near-data processing for machine learning," CoRR, vol. abs/1610.02273, 2016, 9 pages.
(Continued)

*Primary Examiner* — Kyle Vallecillo
(74) *Attorney, Agent, or Firm* — Patterson & Sheridan, LLP; Steven H. Versteeg

(57) ABSTRACT

A method and apparatus for obtaining data from a memory, estimating a probability of data values of the obtained data based on at least one of a source log-likelihood ratio and a channel log-likelihood ratio, wherein each bit in the obtained data has an associated log-likelihood ratio, determining at least one data pattern parameter for the data and performing a decoding process using the at least one data pattern parameters to determine a decoded data set.

19 Claims, 8 Drawing Sheets

(56) References Cited

U.S. PATENT DOCUMENTS

| | | |
|---|---|---|
| 8,898,549 B2 | 11/2014 | Hubris et al. |
| 8,982,952 B2 | 3/2015 | Drezner et al. |
| 9,059,742 B1 | 6/2015 | Anderson et al. |
| 9,135,155 B2 | 9/2015 | Sharon et al. |
| 9,336,483 B1 | 5/2016 | Abeysooriya et al. |
| 9,407,294 B2 | 8/2016 | Hanham et al. |
| 9,690,656 B2 | 6/2017 | Strauss et al. |
| 2004/0258177 A1 | 12/2004 | Shen et al. |
| 2005/0229090 A1 | 10/2005 | Shen et al. |
| 2005/0262421 A1 | 11/2005 | Tran et al. |
| 2005/0262424 A1 | 11/2005 | Tran et al. |
| 2005/0268206 A1 | 12/2005 | Tran et al. |
| 2006/0023636 A1* | 2/2006 | Farhang-Boroujeny ............ H04L 1/0631 370/252 |
| 2006/0085720 A1 | 4/2006 | Tran et al. |
| 2008/0294960 A1 | 11/2008 | Sharon et al. |
| 2010/0030963 A1 | 2/2010 | Marcu et al. |
| 2010/0195384 A1 | 8/2010 | Sharon et al. |
| 2013/0261983 A1 | 10/2013 | Dzakula et al. |
| 2013/0326169 A1 | 12/2013 | Shaharabany et al. |
| 2014/0040704 A1* | 2/2014 | Wu .................. G06F 11/1068 714/773 |
| 2014/0100792 A1 | 4/2014 | Deciu et al. |
| 2015/0214980 A1 | 7/2015 | Xia et al. |
| 2016/0054934 A1 | 2/2016 | Hahn et al. |
| 2016/0246726 A1 | 8/2016 | Hahn |
| 2017/0078677 A1 | 3/2017 | Park et al. |
| 2018/0150248 A1 | 5/2018 | Kwon et al. |
| 2019/0341060 A1 | 11/2019 | Hines et al. |
| 2019/0393734 A1 | 12/2019 | Zhou et al. |

OTHER PUBLICATIONS

U.S. Appl. No. 16/051,416, filed Jul. 31, 2018.
U.S. Appl. No. 16/014,128, filed Jun. 21, 2018.
International Search Report and Written Opinion issued in International Patent Application No. PCT/US2019/067069, dated Apr. 2, 2020 (8 pages).

* cited by examiner

BYTES OF A TEXT FILE IN ASCII FORMAT

CONTENT AWARE DECODING METHOD AND SYSTEM

CROSS-REFERENCE TO RELATED APPLICATIONS

This application is a divisional of U.S. patent application Ser. No. 16/137,256, filed Sep. 20, 2018, which is herein incorporated by reference.

BACKGROUND OF THE DISCLOSURE

Field of the Disclosure

Embodiments of the present disclosure generally relate to data decoding for computer applications. More specifically, aspects of the disclosure relate to content aware decoding methods and systems.

Description of the Related Art

Reliability of solid state drives (SSDs) is a key factor that distinguishes these drives from other conventional memory arrangements. Such SSDs are required to have long term endurance and memory capabilities, especially at end of drive service life.

In order to achieve the high reliability for a SSD, the data stored on the SSD is protected such that it may be recovered, in case of a malfunction. The recovery systems may vary, but one of the most typical is a protection using an Error Code Correction (ECC) code. Most often, ECC codes include low density parity check codes (LDPC) that are used with soft decoders.

Soft ECC decoders have several features that allow the decoder to increase its performance. Soft ECC decoders are programmed to read data and by knowing underlying statistics of the encoded data, more accurate predictions for recovery can be made. In instances where an underlying statistic is not known, the ECC may use default parameters which may correspond to a case of uniform distribution of data.

These conventional decoder approaches, however, have many disadvantages including a high number of bit flips that may lead to wrong estimation of underlying statistics. Adjusting the decoder parameters according to wrong estimated statistics may cause a negative effect. Decoding latency may increase and power consumption may also increase based upon inaccurate decoding.

In more extreme cases, decoding may degrade to a point wherein decoding may fail due to the number of mistakes present within the data. As reliability is an important factor, manufacturers seek to provide methods and apparatus that do not have these significant drawbacks.

There is a need to provide a cost efficient method and apparatus that may decode data using existing data and underlying statistics to safeguard against data loss.

There is a further need to provide such methods and apparatus that may be used in conjunction with SSD technology.

There is a still further need to provide methods and apparatus that more correctly recover data compared to conventional techniques and apparatus.

SUMMARY OF THE DISCLOSURE

The present disclosure generally relates to content aware decoding methods and arrangements. Underlying statistics for data to be recovered are obtained and several methods may be used to utilize this data by a decoder, leading to an increase in decoder correction capability and reduction in decoding latency and improved power consumption.

In one embodiment, a method is disclosed comprising obtaining data from a memory, estimating a probability of data values of the obtained data based on at least one of a source log-likelihood ratio and a channel log-likelihood ratio, wherein each bit in the obtained data has an associated log-likelihood ratio, determining at least one data pattern parameter for the data based on the estimating the probability of the data values, wherein the at least one data pattern parameter includes information on each bit in the obtained data and performing a decoding process using the at least one data pattern parameters to determine a decoded data set.

In another embodiment, a method is disclosed comprising obtaining data from a memory, applying the data to one or more symbol nodes of a network; estimating a probability of data value of the obtained data based on at least one of a source log-likelihood ratio, a channel log-likelihood ratio and a symbol probability distribution list, wherein each bit in the obtained data has an associated log-likelihood ratio and is associated with a value in each bit location, and wherein the symbol probability distribution list is based on the probability of occurrence of each symbol, determining at least one data pattern parameter for the data based on the estimating, wherein the at least one data pattern parameter includes information on each bit in the obtained data and performing a decoding process using the at least one data pattern parameters to determine a decoded data set.

In a further example embodiment, a method may be performed comprising obtaining data from a memory, the data needing to be decoded, comparing the data from the memory to a list of patches and augmenting the data from the memory when the comparing the data from the memory to the list of patches indicates a match of the data to a specific patch to produce an augmented data and decoding the augmented data.

In another example embodiment, a method is disclosed comprising obtaining data of a memory block, wherein the data is a sample of bits of a block of data of a given length, each of the bits having a bit value, comparing the snapshot to a predetermined data pattern, estimating at least one bit value for the data based on the comparison and adjusting the bit values based on the estimation.

In another example embodiment, a device is disclosed comprising at least one memory device and a controller coupled to the at least one memory device, the controller configured to provide a content-aware decoding process configured to reduce a scope of the decoding process, wherein the content-aware decoding process samples a block of data in the one or more memory devices to estimate bit values in the block of data based on a log-likelihood ratio, and wherein the log-likelihood ratio is associated with a number of ones and zeroes in each bit location.

In another non-limiting embodiment, an arrangement is disclosed comprising means for obtaining data from a memory, means for estimating a probability of data values of the obtained data based on at least one of a source log-likelihood ratio and a channel log-likelihood ratio, wherein each bit in the obtained data has an associated log-likelihood ratio, means for determining at least one data pattern parameter for the data based on the estimating the probability of the data values, wherein the at least one data pattern parameter includes information on each bit in the obtained data and means for performing a decoding process using the at least one data pattern parameters to determine a decoded data set.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
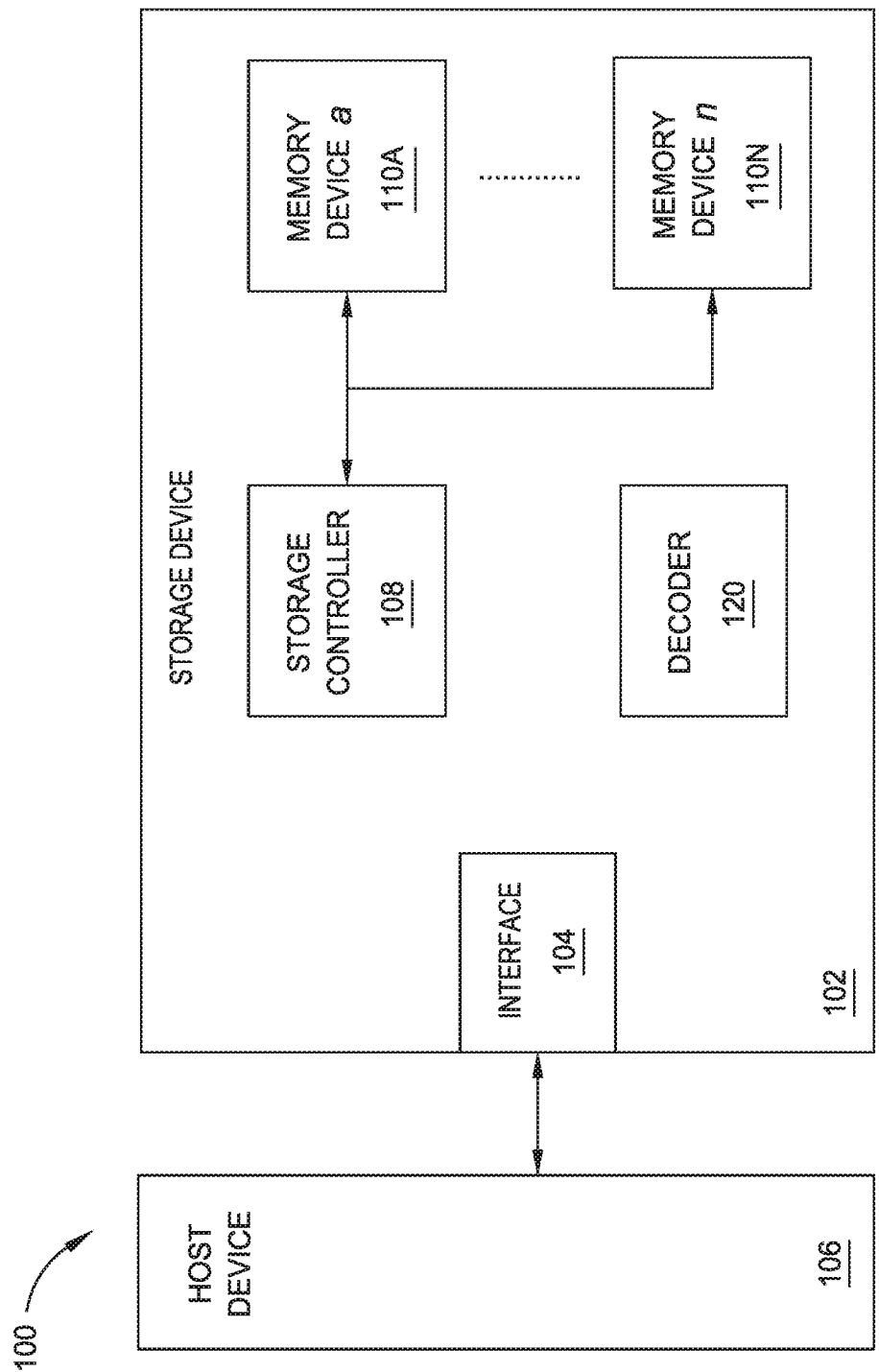
FIG. 1 is an arrangement of a host device and storage device with accompanying interface and decoder.

Referring to FIG. 1, an arrangement 100 of a host device 106 and a storage device 102 is illustrated. Data may be sent and received through an interface 104 between the host device 106 and the storage device 102. The interface 104 is configured to interface with the host device 106, namely accept data and/or command requests as provided by the host device 106 for processing by the storage device 102. A decoder 120 is present in the storage device for decoding data as needed. A storage controller 108 is provided in the storage device 102 to control either a single memory device 110A or multiple memory devices 110N. In the illustrated embodiments, the storage device 102 may be a single or number of SSDs for storage of information.

Aspects of the disclosure use the elements/components described in FIG. 1 to enable execution of several methods to utilize data in a decoder, which will lead to an increase in the correction capability and reduction in the decoding latency and power consumption. These methods will cause data to be read with a higher accuracy compared to conventional methods. The aspects of the disclosure may use structure, found in the data itself, to enable more consistent decoding.

In aspects described, data is scanned using a sliding window approach, wherein an estimation of "0's" and "1's" data values is performed in the window. This data may then be used to adjust the decoder for more accuracy.

In many cases, data written to flash memory, such as NAND based SSD's, has structure to it. As described above, the memory devices 110A-110N may be based on flash memory (NAND) technology. The structure can be a property of a user source (e.g. if the saved data is textual in origin). In other embodiments, the structure can be a property of the way the NAND is used (e.g. tables written by the firmware, data padded with zeros etc.) In either case, finding such structures and considering the structures in the decoding process can yield significantly higher correction capability than attempting to perform error correction without using such structure.

Aspects of the disclosure describe a set of content aware methods to decode data read from the NAND. In the methods described, the data is used to determine structure or patterns that are within the data, which eventually provide better decoding abilities.

Incorporation of Content Information into Error Code Correction Decoders

In order to ensure high reliability in memory devices, such as SSDs, data that is written to the memory device is protected with an ECC code. As an example, typical ECC codes may be low density parity check codes with soft decoders.

In soft decoders 120, such as that disclosed in FIG. 1, a metric may be used to be describe a probability of data that is read to be a "1" value or a "0" value. This metric is defined as the log-likelihood ratio (LLR) metric.

Given that the read data is a vector of $\underline{y}$, the LLR value of bit i is calculated according to the following formula:

$$LLR_i = \log_2\left(\frac{Pr\{bit_i = 0/\underline{y}\}}{Pr\{bit_i = 1/\underline{y}\}}\right) = \log_2\left(\frac{Pr\{\underline{y}/bit_i = 0\} \cdot Pr\{bit_i = 0\}}{Pr\{\underline{y}/bit_i = 1\} \cdot Pr\{bit_i = 1\}}\right) =$$
$$= \underbrace{\log_2\left(\frac{Pr\{\underline{y}/bit_i = 0\}}{Pr\{\underline{y}/bit_i = 1\}}\right)}_{LLR\_Channel} + \underbrace{\log_2\left(\frac{Pr\{bit_i = 0\}}{Pr\{bit_i = 1\}}\right)}_{LLR\_Source}$$

In the definition provided above, the LLR_Channel portion of the LLR metric is based on statistics. The LLR_Channel portion can be pre-defined by several methods. A statistical model may be used in the predefinition. In other embodiments, the predefinition may be based on experiments. In still further embodiments, the predefinition may be calculated online based on channel estimation methods.

The LLR_Source portion of the LLR metric provided above may be based on the statistics of the source. In the absence of prior knowledge, it may be assumed that the source data is uniformly distributed ($Pr\{bit_i=0\}=Pr\{bit_i=1\}=0.5$) which means that the LLR_Source part is equal to zero. In other embodiments, the source data may be distributed in a non-uniform manner. As it is a common practice in storage systems to scramble the data being stored, the assumption of a uniform distribution is valid. As the encoded data can be descrambled, uncovering the structures and statistics of the original data, the LLR_Source can be calculated.

Figure 2:
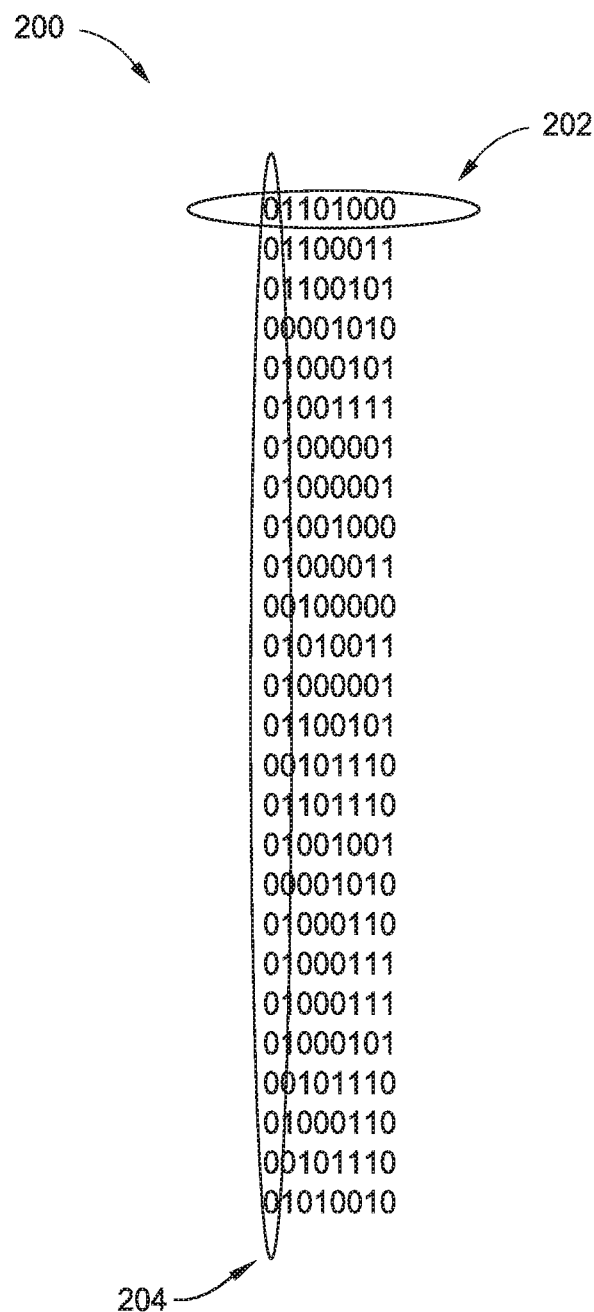
FIG. 2 is a graph of data byes of a text file in ASCII format.

Knowing the underlying statistics of the data may help the decoder in obtaining correct results when decoding data compared to conventional methods which do not use such methods. An example embodiment of the disclosure will be described such that knowing the underlying statistics assists the decoder 120 to produce decoded data that is correct. Referring to FIG. 2, a text file 200 in ASCII format is illustrated. Each character in ASCII is a byte 202 and all the most common characters only occupy the seven (7) least significant bits of the byte. If the ECC decoder, for example, understood that the data is shaped (structured) like presented on FIG. 2, the ECC decoder could alter the decoding parameters to reflect this data shape (changing the probability of the I/O distribution in every byte's most significant bit) and thus improve performance and correction capability. A sliding window 204 is provided for analysis of significant bits in the vertical direction.

Obtaining Data Patterns

As discussed above, when decoding data, knowing that the data has underlying statistics and data patterns is helpful. One main problem with this technique is that at the time of decoding, the data may incorporate noise and the data patterns or statistics may be corrupted. Two methods may be used to mitigate the effects of noise and/or data corruption.

Mitigation of Noise and/or Data Corruption Method 1

The first method to mitigate the effects of noise and/or data corruption is to learn and store data during the encoding process, wherein all the data in a clean version passes through the encoder. Statistics of the data may be gathered during the encode process and saved for future use. The statistics may be retrieved when decoding depending on the way the statistics are stored and feeding the statistics to the decoder alongside with the read data from the NAND.

As SSDs have large capacities, keeping/storing data during the encoding process may be performed without detrimental effect. Devices that are more space sensitive may save these statistics for groups of pages or even whole sections, for example, the whole mapping table that translates physical to logical locations has a very specific structure, which using a few bytes of memory, can describe gigabytes of data, speeding significantly the latency of translated address.

Mitigation of Noise and/or Data Corruption Method 2

Another approach is to use an iterative estimation of the data. Iteration between data estimation and decoding can be performed, where each iteration of decoding corrects more bits and gives help to improve the data estimation which in turn improves the decode results. Hence, there is a positive feedback process—as the decoder "cleans" more errors, the data source statistics can be estimated more accurately, which in turn allows the decoder to detect more errors.

Aspects of the disclosure show how to obtain several forms of statistics and labels representing the data, in a manner that is not\less sensitive to noises from the NAND.

In addition, aspects of the disclosure describe several methods that use data to increase the correction capability, reduce the decoding latency and power consumption, in general and in comparison to conventional techniques.

Example Methods Utilizing Data Patterns

Four example embodiments are disclosed herein, each of the embodiments describing a different method to use data patterns and statistics during a decoding operation. Each method is unique and will outperform conventional methods given a certain type of structure, as discussed in each embodiment.

LLR Tuner

As provided in FIG. 2, in case of a text file, the most significant bit in each byte is always zero. Thus, in the general case, sometimes there is a gain in decoding accuracy by dividing the data to be evaluated into portions smaller than the whole and obtain statistics of the bits according to their position within the smaller data portions or chunks.

In one embodiment, the data is divided into data chunks of size K, then for each index within a K-tuple (0 ... K−1) the probability of the bit in this position to be "0" and the probability of the bit to be "1" are computed. This computation is done by running over all K-tuples and counting the number of zeros/ones in index j within the K-tuple.

Assuming that the length of the data is N and that $b_i$ is the i-th bit of the data then for each K-tuple, the LLR source for the j-th bit within the K-tuple is computed according to the following formula:

$$LLR_j = \log_2\left(\frac{\sum_{t=0}^{\frac{N}{K}-1}(1-b_{j+t\Box K})}{\sum_{t=0}^{\frac{N}{K}-1}b_{j+t\Box K}}\right), j = 0 \ldots (K-1)$$

For the example presented in FIG. 2, K is equal to 8 (for dividing the data into bytes) and $LLR_7$ is a high positive value, which indicates that the eighth bit in every byte is zero with high probability.

The learning of the statistics can be done in global manner for the entire amount of data. Additional approaches can divide the data into different regions and for each region, the statistics will be learned locally.

Another embodiment is to use a sliding window approach, where the source data statistics used for computing the source LLRs of the next data chunk are based on the current window. In a still further embodiment, another option is to use a weighted window, giving more weight to the recent history and less weight to the far history, such that far history is gradually forgotten and that recent history is provided more importance during decoding.

Symbol Tuner

In this example embodiment, it is known that the bits in the data are dependent. For example, in a text file, the bits are organized in bytes where each byte represents a character. In the example of a text file, the most used characters are alphanumeric, spaces and punctuation marks, while the rest of the characters are less common. This indicates that bits from the same byte are statistically dependent and knowing part of the bits within a byte increases the reliability of the other bits within the same byte.

The data may be divided into groups such that all bits in a group are statistically dependent. Each group is considered as a symbol.

Figure 3:
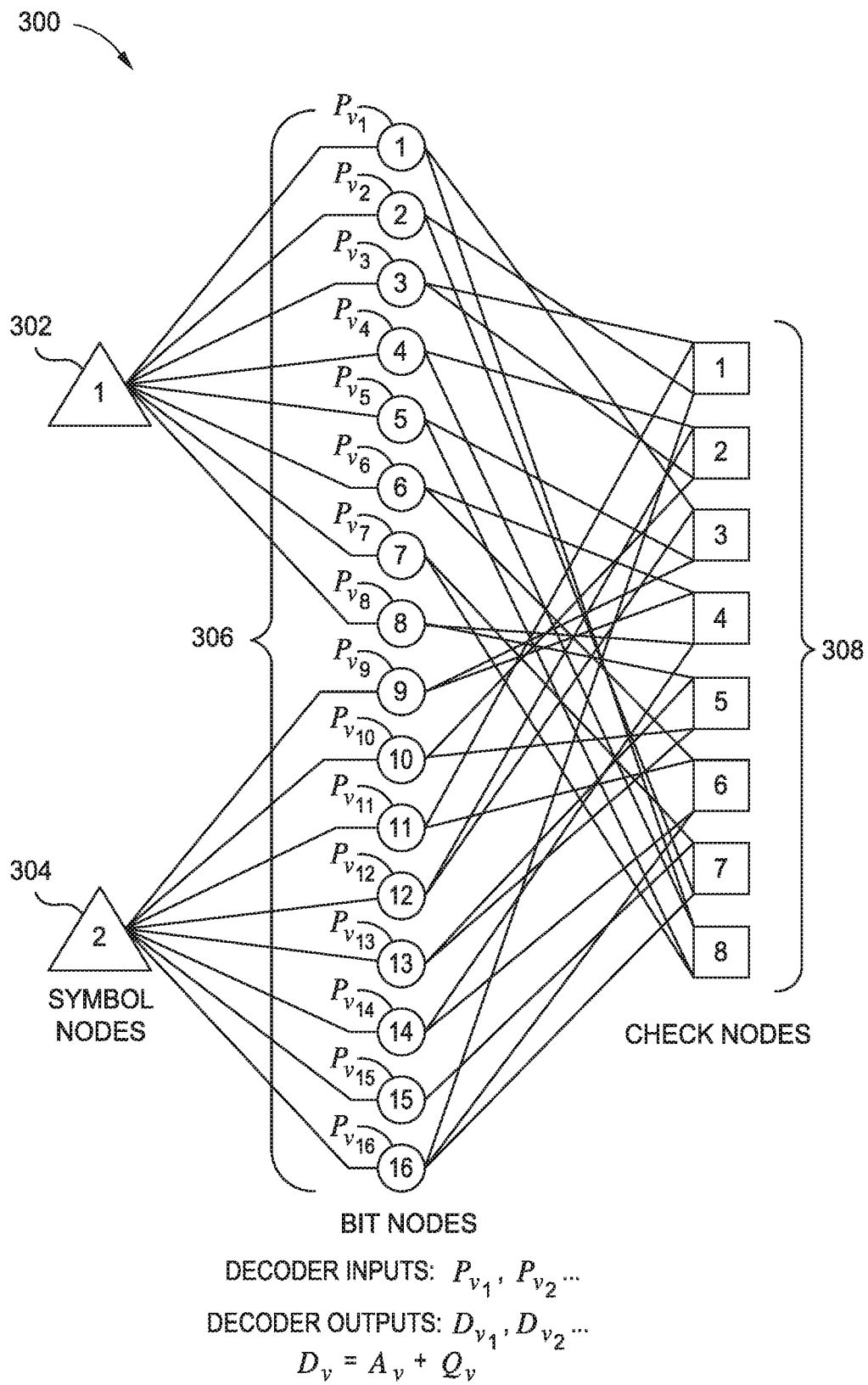
FIG. 3 is a graph of an Iterative content aware decoder.

A LDPC decoder, named as ICAD ("iterative content aware decoder"), is provided in the arrangements described, wherein the LDPC decoder utilizes a connection between bits from the same symbol. The new decoder is described via a short code example in FIG. 3. Check nodes 308 are provided to check the values in each of the bit nodes to ensure that the values within are accurate. The check nodes 308 are provided to hold parity constraints on the codeword bits and according to these constrains the bit nodes are improving overall reliability.

Figure 3A:
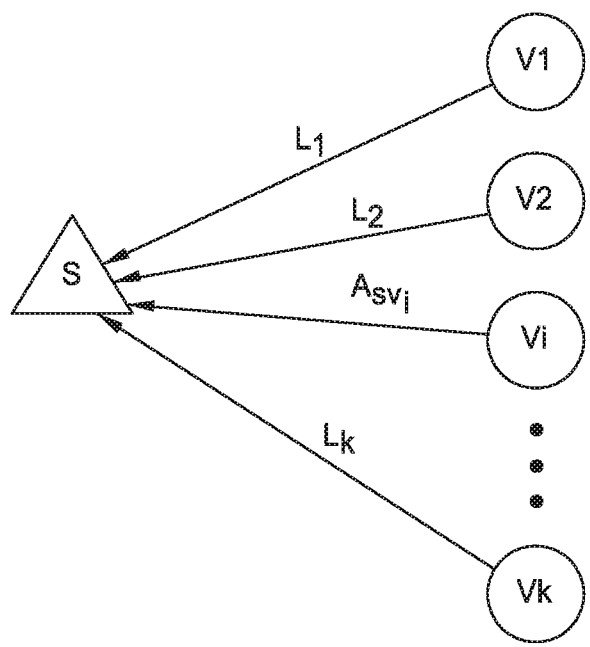
FIG. 3A is a schematic of messages of a single symbol node transmitted to adjacent bit nodes.

The difference between the ICAD 300 and the original LDPC decoder is that the ICAD has additional nodes called 'symbol nodes'. In the example from FIG. 3, the symbols are groups of 8 bits. During the decoding process performed by the ICAD 300, each symbol node 302, 304 sends a message to each bit node Pv1-16 from this symbol 302, 304 that represents the probability of the bit to be "0" or "1" according to the information from the other bits of the same symbol and the statistics that reflect the probability of each symbol. As mentioned above, there are several techniques in order to obtain the probability of each symbol to occur. One of these techniques is provided in FIG. 3A. In this example embodiment, messages from symbol node s to bit node v may be described as below:

$$A_{sv_i} = \log_2 \frac{\sum_{b \in B_i^0} Pr\{b\} \cdot 2^{\sum_{j \in \{1...k\} \setminus i} L_j \cdot (1-b_j)}}{\sum_{b \in B_i^1} Pr\{b\} \cdot 2^{\sum_{j \in \{1...k\} \setminus i} L_j \cdot (1-b_j)}}$$

where:
$B_i^t$—set of all symbols of length k such that the i-th bit is equal to t (t=0 or 1).
b in this formula refers to a specific symbol value.
$b_j$—is the value of the j-th bit in symbol b.
$\{1 \ldots k\} \setminus i$—means a set of all indices between 1 to k but without index i.
$L_j$—the LLR of bit node $v_j$ According to the statistics that reflect the probability of each symbol, the Pr{b} terms in the formula are obtained.

For a decoding procedure, the messages from bit nodes to symbol nodes may be expressed in other forms. As a non-limiting example:

Message from bit node v to symbol nodes s:

$$Q_v = P_v + \sum_{c' \in N_R(v)} R_{c'v}$$

Message from bit node v to check nodes c:

$$Q_{vc} = A_{sv} + P_v + \sum_{c' \in N_R(v) \setminus c} R_{c'v}$$

Message from check nodes c to bit node v:

$$R_{cv} = \varphi^{-1}\left(\sum_{v' \in N_L(c) \setminus v} \varphi(Q_{v'c})\right)$$

Where:
$N_{L/R(i)}$—left/right neighbor of node i in the graph.

$$\varphi(x) = \left\{sign(x), -\text{logtanh}\left(\frac{|x|}{2}\right)\right\}$$

and operations in the φ domain are done over the group $\{0,1\} \times R^+$

These probabilities can be learned during the encoding procedure where the data is obtained without errors. By scanning the data and counting the occurrence of each symbol in the data, probabilities are computed and stored as additional information for future reads of these data.

These probabilities can be learned from the read data itself. The number of errors is sufficiently low in order to obtain these probabilities with high accuracy.

These probabilities may also be estimated during the decoding procedure. At each stage of the decoding, each bit holds its probability to be "0" or "1". Given these probabilities, the probabilities for the occurrence of each symbol can be obtained.

Multiple Patches Technique

This embodiment describes a non-local approach that does not assume any local statistics. It rather assumes similarity of patches in the data, and if such similarity exists, the method computes the a-prior probability of a bit to in respect to similar patches, or in a more coarse approach flips bits.

Figure 4:
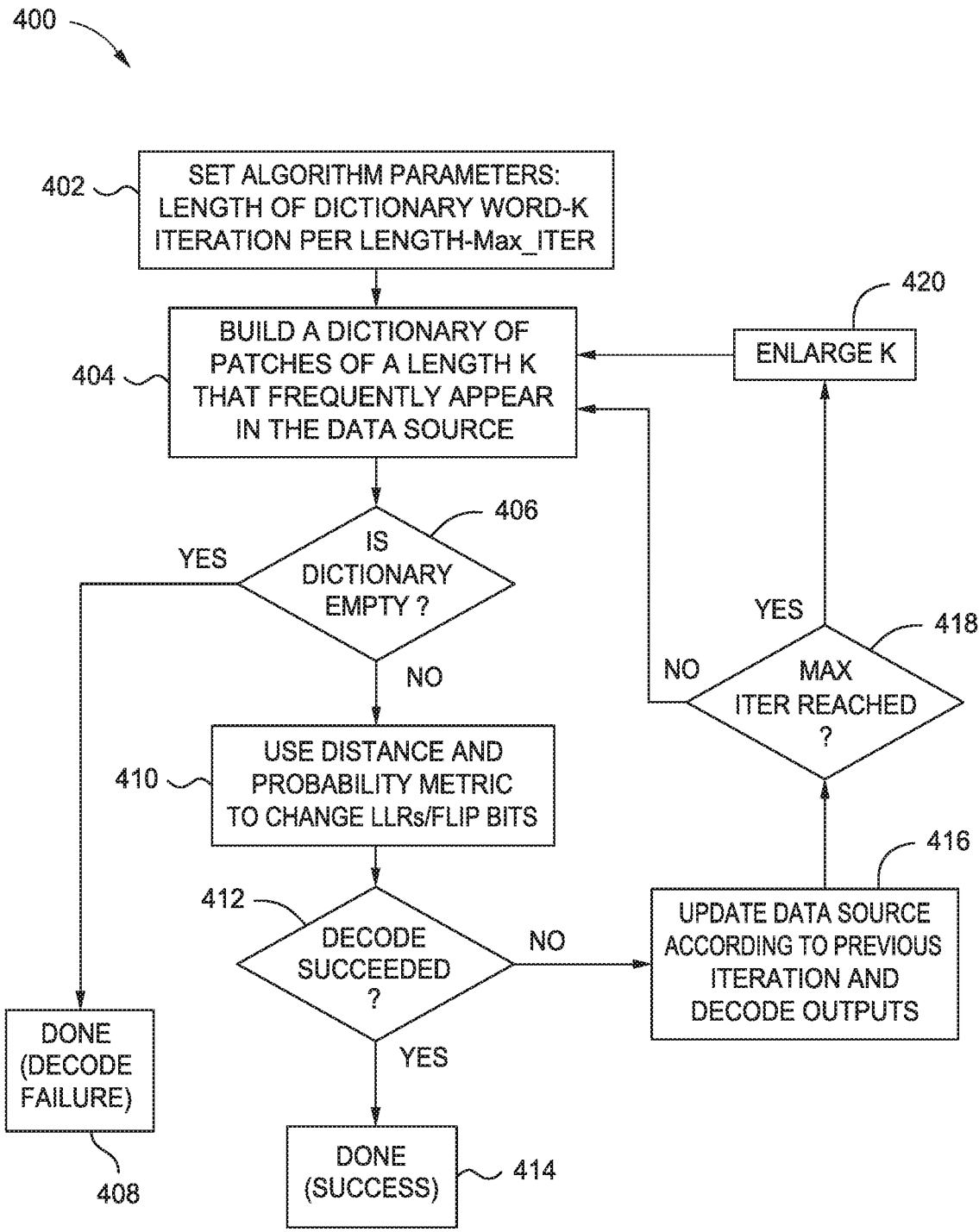
FIG. 4 is a flow chart for a method of utilizing data patterns through a multiple patch technique.

As shown in FIG. 4, the process is iterative, and switches between estimating the bits according to a new dictionary and decoding.

The method starts by creating a dictionary of all words of a length certain length in the data source that appear enough times. A sliding window approach is used to estimate each bit, where a bits neighborhood is compared to the dictionary and according to similar patches, the bit value\correction term is calculated.

Several metrics can be used to estimate a bits value, among them a KNN approach, where each bit gets a correction term according to the probability of 1/0 in the middle element of the K nearest patches. A weight is given to the probability of each patch to appear where K can vary from 1 to the size of the dictionary.

After estimation of all the bits a decode process is performed. If the decode fails the process can be repeated using the data estimations given by the previous iteration to create a new dictionary and start a new estimation. The process can also be repeated for various window sizes.

Referring to FIG. 4, a method 400 is provided such that multiple patches may be used for data pattern usage. The method 400 starts at 402 wherein algorithm parameters are set, including a length of a dictionary, word k iteration and per length Max ITER. The method proceeds from 402 to 404, wherein a dictionary of patches is built of a length K that frequently appear in the data source. A threshold amount may be used to establish the minimum number of times of appearance that may be made. The method then proceeds to 406, wherein a query is made if the dictionary is empty. If the dictionary is empty, then a decode failure has been encountered at 408 and a flag or notification may be made to the system and/or user. If the dictionary is not empty, then data in a memory is evaluated wherein distance and probability metrics (patches) may be used to change or flip the respective bits at 410. Another query is performed at 412 to identify if the decode has succeeded. If the decode was successful, then the method ends at 414. If the decoding was not successful, the method proceeds to 416 wherein the data source is updated according to decoding outputs and any previous iterations. The method then proceeds to 418 wherein a check on the maximum number of iterations is performed. If the maximum number of iterations has been achieved at 418 then the method proceeds to 420 where the value K is enlarged with the method returning to 404. If the maximum ITER is not reached at 418, the method returns to 404, without enlarging K.

Data Interpolation Technique

In some cases, the data may have a local pattern, where for several bytes there is a distinct pattern but when looking at the overall statistics they will average out, or have a less distinct influence. For example "0"s or "1"s padding at the end of the data (either at the original data or added by the firmware), or files system data where the addressed which increment slowly and may resemble a linear function.

By looking at the neighborhood of the each bit, an estimate may be made as to what the value of the data. Using a sliding window approach for each middle element of a window, the neighborhood values may be fitted against a predefined function. In another embodiment, the neighborhood values may be fitted against a set of predefined functions. If the neighborhood is similar, a correction term\bit value can be calculated for the middle element. Processing over all bits of the data creates a full data estimation. This process can be performed once for the data. In other embodiments, the process may be repeated several times, and over several neighborhood sizes.

At any step of the estimation process a decode process can be tried, in case of failure the decoder outputs can be used to improve the estimation of the data, thus iterating between decoding and estimating until a successful decode or timeout.

Figure 5:
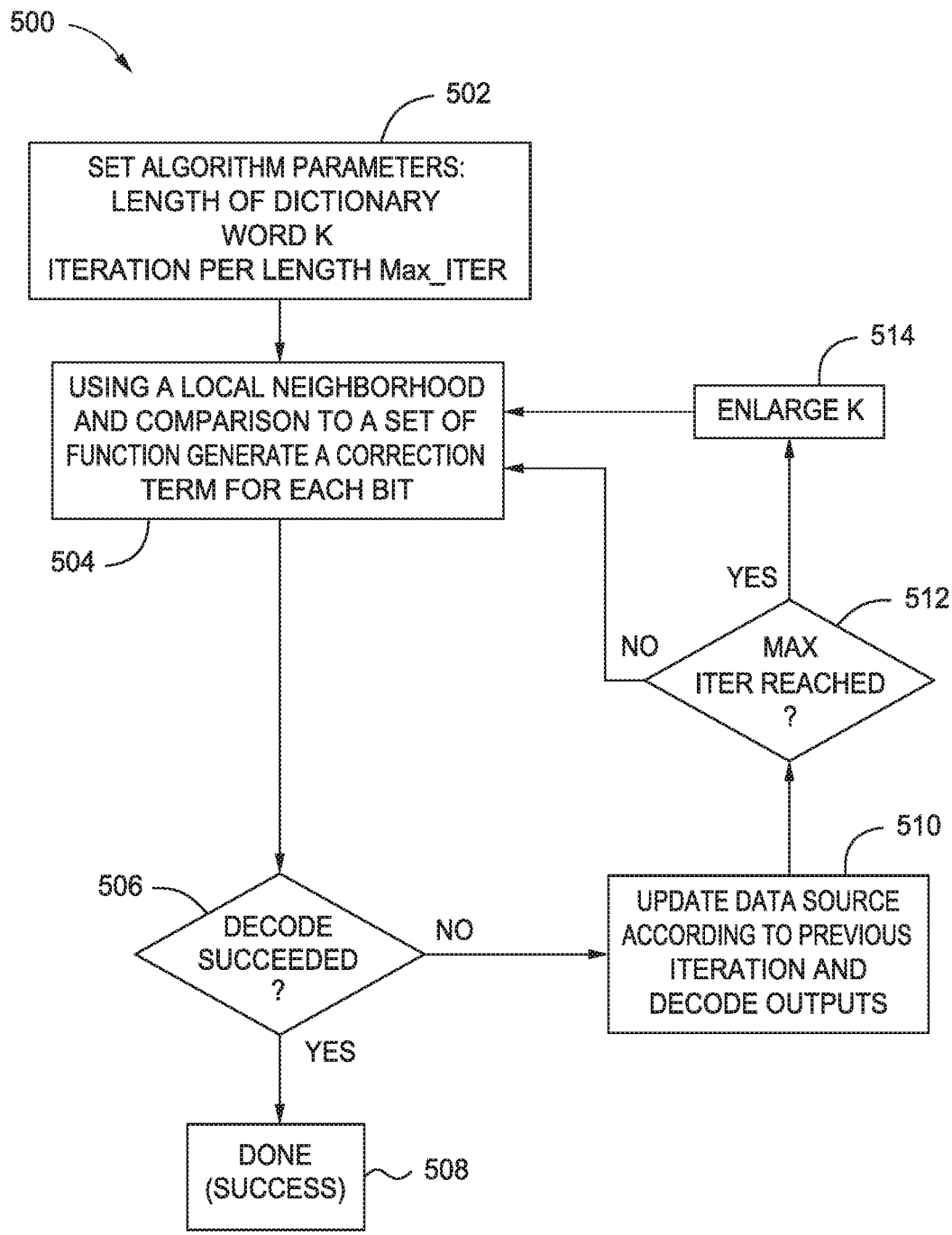
FIG. 5 is a flow chart for a method of utilizing data patterns through a data interpolation technique.

Referring to FIG. 5, a method 500 for using data interpolation is provided for data pattern usage. The method starts at 502 wherein algorithm parameters are set, such as a length of a dictionary word K and iteration per length Max_ITER. The method then proceeds to 504 wherein using a local pattern for data and comparing each piece of data to the local pattern a correction term may be developed for each bit. The method then proceeds to 506 wherein a query is run to determine if the decoding has proceeded successfully. If the decoding has proceeded successfully, then the method progresses to an end at 508. If the decoding has not succeeded, then the method proceeds to 510 wherein the data source is updated according to previous iterations and decoding outputs. The method then proceeds to 512 wherein a check on the maximum number of iterations is performed. If the maximum number of iterations has been achieved at 512 then the method proceeds to 514 where the value K is enlarged with the method returning to 504. If the maximum ITER is not reached at 512, the method returns to 504, without enlarging K.

Simulation Results

Figure 6:
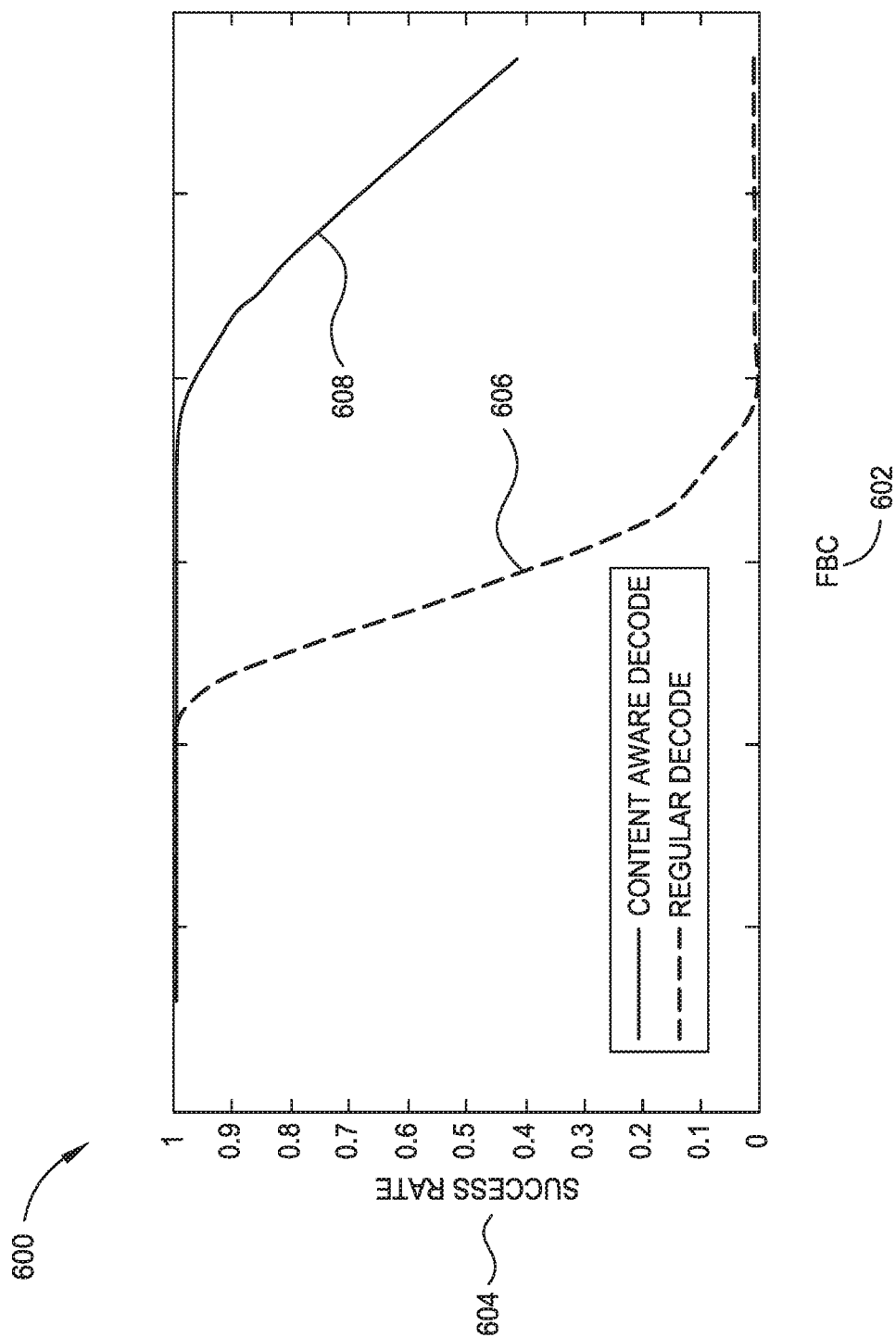
FIG. 6 graph of enhancement of correction capability via use of aspects of the disclosure.

The following figures shows the improvements of using this invention. FIG. 6 shows the improvement in correction capability wherein the graph 600 is of a success rate vs the number of bit flips in data chunks. The X-axis 602 corresponds to the number of bit flips in data chunk and the Y-axis 604 corresponds to the decode success rate out of 128 data chunks from the sequential read. The "lower" curve corresponds to the default decoder, without any knowledge of the underlying statistics. The "upper" curve utilizes the underlying structure and corresponds to the content aware decoding methods, where the underlying statistics where estimated in an iterative manner.

In this example the content aware approach can handle twice the amount of bit error rate that a regular decoder can. At the point where the default decoder cannot decode at all the enhanced decoder still maintains almost 100% of successful decoding.

Figure 7:
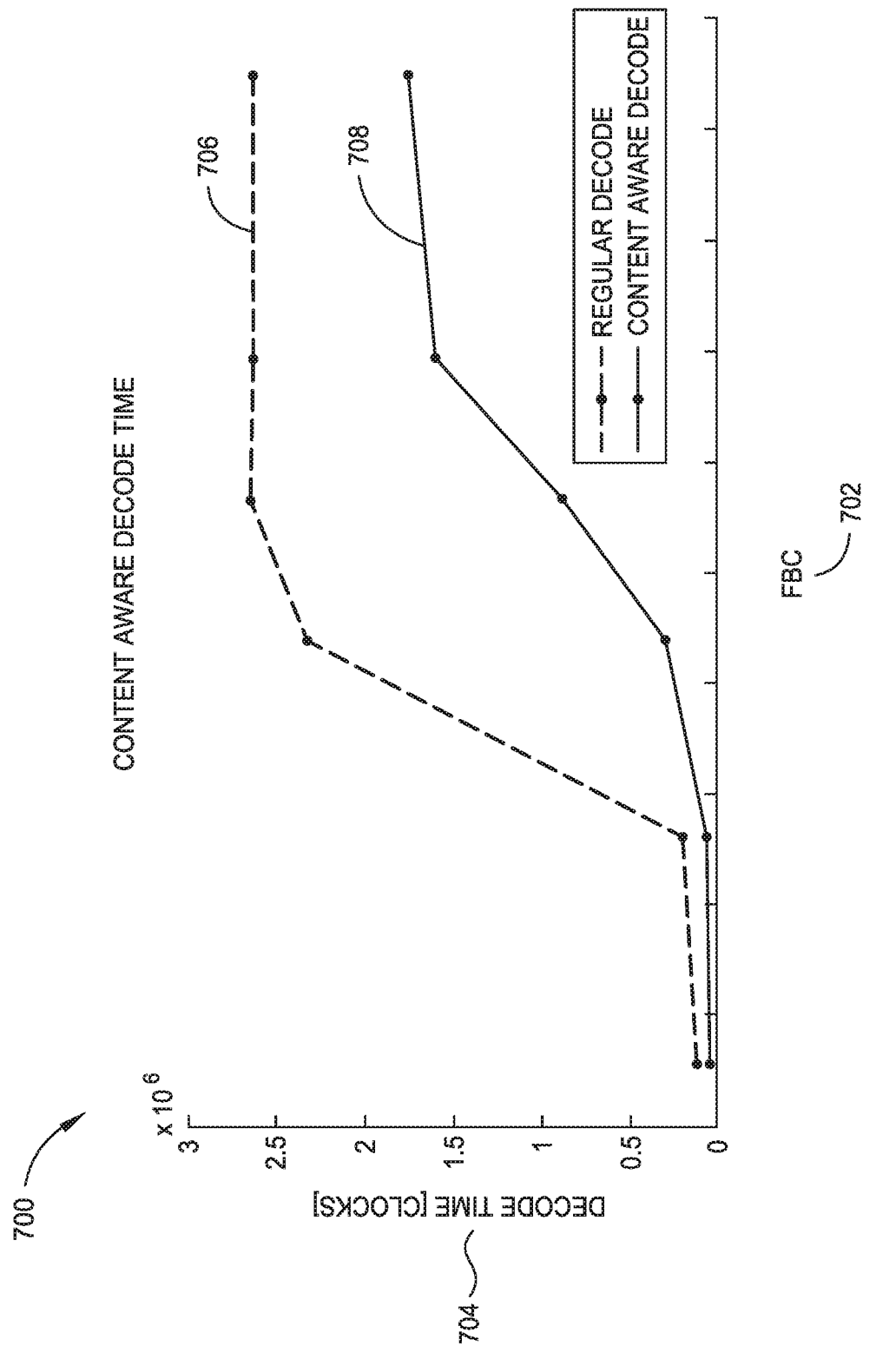
FIG. 7 is a graph of reduction of decoding latency via use of aspects of the disclosure.

Referring to FIG. 7, an improvement in decoding latency is also present. FIG. 7 provides a graph 700 of decode time vs. the number of flipped bits in data chunks. The X-axis 702 corresponds to the number of bit flips in data chunk and the Y-axis 704 corresponds to the average decoding latency according to 128 data chunks from the sequential read.

The "upper" curve 706 corresponds to the default decoder, without any knowledge of the underlying statistics. The "lower" curve 708 corresponds to the case where the decoder uses the underlying statistics of the data. As can be seen from FIG. 7, even in the region where both the default decoder and the enhanced decoder decode with 100% success rate, the enhanced decoder converge with lower latency.

In one non-limiting embodiment, a method is disclosed comprising obtaining data from a memory, estimating a probability of data values of the obtained data based on at least one of a source log-likelihood ratio and a channel log-likelihood ratio, wherein each bit in the obtained data has an associated log-likelihood ratio, determining at least one data pattern parameter for the data based on the estimating the probability of the data values, wherein the at least one data pattern parameter includes information on each bit in the obtained data and performing a decoding process using the at least one data pattern parameters to determine a decoded data set.

In another non-limiting embodiment, the method may be performed wherein the obtained data is obtained from a sliding window sample.

In a still further non-limiting embodiment, the method may be performed wherein the probability of the data values is estimated for multiple bits simultaneously.

In a further non-limiting embodiment, the method may further comprise performing an iterative estimation process for the data prior to the decoding process.

In another embodiment, a method is disclosed comprising obtaining data from a memory, applying the data to one or more symbol nodes of a network; estimating a probability of data value of the obtained data based on at least one of a source log-likelihood ratio, a channel log-likelihood ratio and a symbol probability distribution list, wherein each bit in the obtained data has an associated log-likelihood ratio and is associated with a value in each bit location, and wherein the symbol probability distribution list is based on the probability of occurrence of each symbol, determining at least one data pattern parameter for the data based on the estimating, wherein the at least one data pattern parameter includes information on each bit in the obtained data and performing a decoding process using the at least one data pattern parameters to determine a decoded data set.

In another example embodiment, the method may be performed wherein estimating the probability of data value is determined during an encoding process.

In a further example embodiment, the method may be performed wherein the estimating the probability of data value is performed by scanning the data and counting an occurrence of each symbol in the data.

In a further example embodiment, the method may be performed wherein the probability of a data value is estimated during the decoding process to determine a probability of an occurrence of each symbol.

In a further example embodiment, a method may be performed comprising obtaining data from a memory, the data needing to be decoded, comparing the data from the memory to a list of patches and augmenting the data from the memory when the comparing the data from the memory to the list of patches indicates a match of the data to a specific patch to produce an augmented data and decoding the augmented data.

In a further example embodiment, the method may be performed wherein the data is a sample of bits of a block of data.

In a further example embodiment, the method may be performed wherein the list of patches include a distance metric.

In another example embodiment, the method may be performed wherein the list of patches include a probability metric.

In another non-limiting embodiment, the method may be performed wherein the list of patches is predetermined.

In another non-limiting embodiment, the method may further comprise checking the decoding of the augmented data.

In another non-limiting embodiment, the method may further comprise updating the data in the memory when the decoding of the augmented data is not successful.

In another non-limiting embodiment, the method may further comprise checking a number of iterations performed on updating the data in the memory, ending the method when the number of iterations performed equals a maximum number of iterations allowed and performing another iteration of the comparing the data to the list of patches when the number of iterations performed is less than the maximum number of iterations.

In another example embodiment, a method is disclosed comprising obtaining data of a memory block, wherein the data is a sample of bits of a block of data of a given length, each of the bits having a bit value, comparing the snapshot to a predetermined data pattern, estimating at least one bit value for the data based on the comparison and adjusting the bit values based on the estimation.

In another example embodiment, the method may be performed wherein the predetermined data pattern is a mathematical linear function.

In another example embodiment, the method may further comprise lengthening an amount of obtained with each execution of the method.

In another example embodiment, the method may be performed wherein adjusting the bit values includes generating and applying a correction term to the bit values.

In a still further embodiment, the method may be performed wherein the method is executed multiple times with snapshots of different blocks of data of the memory block.

In another example embodiment, a device is disclosed comprising at least one memory device and a controller coupled to the at least one memory device, the controller configured to provide a content-aware decoding process configured to reduce a scope of the decoding process, wherein the content-aware decoding process samples a block of data in the one or more memory devices to estimate bit values in the block of data based on a log-likelihood ratio, and wherein the log-likelihood ratio is associated with a number of ones and zeroes in each bit location.

In another non-limiting embodiment, the device further comprises a controller that is further configured with a predetermined list of patches.

In another non-limiting embodiment, the device may be configured wherein the content-aware decoding process resides in firmware in the controller.

In another non-limiting embodiment, an arrangement is disclosed comprising means for obtaining data from a memory, means for estimating a probability of data values of the obtained data based on at least one of a source log-likelihood ratio and a channel log-likelihood ratio, wherein each bit in the obtained data has an associated log-likelihood ratio, means for determining at least one data pattern parameter for the data based on the estimating the probability of the data values, wherein the at least one data pattern parameter includes information on each bit in the obtained data and means for performing a decoding process using the at least one data pattern parameters to determine a decoded data set.

In another non-limiting embodiment, the arrangement may be configured wherein the means for obtaining data obtains data from one of a memory and a solid state drive.

While the foregoing is directed to embodiments of the present disclosure, other and further embodiments of the disclosure may be devised without departing from the basic scope thereof, and the scope thereof is determined by the claims that follow.

What is claimed is:
1. A method, comprising:
obtaining data from a memory;
estimating a probability of data values of the obtained data based on at least one of a source log-likelihood ratio and a channel log-likelihood ratio, wherein each bit in the obtained data has an associated log-likelihood ratio;
determining at least one data pattern parameter for the obtained data based on the estimating the probability of the data values, wherein the at least one data pattern parameter includes information on each bit in the obtained data; and
performing a decoding process using the at least one data pattern parameters to determine a decoded data set.

2. The method according to claim 1, wherein the obtained data is obtained from a sliding window sample.

3. The method according to claim 1, wherein the probability of the data values is estimated for multiple bits simultaneously.

4. The method according to claim 1, further comprising:
performing an iterative estimation process for the data prior to the decoding process.

5. The method of claim 1, wherein the estimating the probability is based on the source log-likelihood ratio.

6. A method, comprising:
obtaining data from a memory;
applying the data to one or more symbol nodes of a network;
estimating a probability of data value of the obtained data based on at least one of a source log-likelihood ratio, a channel log-likelihood ratio, and a symbol probability distribution list, wherein each bit in the obtained data has an associated log-likelihood ratio and is associated with a value in each bit location, and wherein the symbol probability distribution list is based on a probability of occurrence of each symbol;
determining at least one data pattern parameter for the obtained data based on the estimating, wherein the at least one data pattern parameter includes information on each bit in the obtained data; and
performing a decoding process using the at least one data pattern parameter to determine a decoded data set.

7. The method according to claim 6, wherein estimating the probability of data value is determined during an encoding process.

8. The method according to claim 7, wherein the estimating the probability of data value is performed by scanning the data and counting an occurrence of each symbol in the data.

9. The method of claim 6, wherein the probability of data value is estimated during the decoding process to determine a probability of an occurrence of each symbol.

10. The method of claim 6, wherein the estimating the probability is based on the channel log-likelihood ratio.

11. The method of claim 6, wherein the estimating the probability is based on the symbol probability distribution list.

12. A device, comprising:
   at least one memory device; and
   a controller coupled to the at least one memory device, the controller configured to provide a content-aware decoding process configured to reduce a scope of the decoding process, wherein the content-aware decoding process samples a block of data in the at least one memory device to estimate bit values in the block of data based on a loci-likelihood ratio, and wherein the log-likelihood ratio is associated with a number of ones and zeroes in each bit location, and wherein the controller is further configured with a predetermined list of patches.

13. A device, comprising:
   at least one memory device; and
   a controller coupled to the at least one memory device, the controller configured to provide a content-aware decoding process configured to reduce a scope of the decoding process, wherein the content-aware decoding process samples a block of data in the at least one memory device to estimate bit values in the block of data based on a log-likelihood ratio, and wherein the log-likelihood ratio is associated with a number of ones and zeroes in each bit location, and wherein the content-aware decoding process resides in firmware in the controller.

14. A device, comprising:
   at least one memory device; and
   a controller coupled to the at least one memory device, the controller configured to:
      provide a content-aware decoding process configured to reduce a scope of the decoding process, wherein the content-aware decoding process samples a block of data in the at least one memory device to estimate bit values in the block of data based on a loci-likelihood ratio, and wherein the log-likelihood ratio is associated with a number of ones and zeroes in each bit location; and
      build a dictionary of patches of a length that frequently appears in a data source.

15. An arrangement, comprising:
   means for obtaining data from a memory;
   means for estimating a probability of data values of the obtained data based on at least one of a source log-likelihood ratio and a channel log-likelihood ratio, wherein each bit in the obtained data has an associated log-likelihood ratio;
   means for determining at least one data pattern parameter for the obtained data based on the estimating the probability of the data values, wherein the at least one data pattern parameter includes information on each bit in the obtained data; and
   means for performing a decoding process using the at least one data pattern parameter to determine a decoded data set.

16. The arrangement according to claim 15, wherein the means for obtaining data obtains data from one of a memory and a solid state drive.

17. The arrangement of claim 15, wherein the decoding process comprises setting algorithm parameters of a length of a dictionary, a word k, and an iteration per length Max_ITER.

18. The arrangement of claim 17, wherein the decoding process further comprises using a local neighborhood and comparison to a set of function to generate a correction term for each bit.

19. The arrangement of claim 18, wherein the decoding process further comprises updating a data source according to previous iteration and decoding outputs.

* * * * *